(12) United States Patent
Schulze et al.

(10) Patent No.: US 7,915,675 B2
(45) Date of Patent: Mar. 29, 2011

(54) IGBT HAVING ONE OR MORE STACKED ZONES FORMED WITHIN A SECOND LAYER OF THE IGBT

(75) Inventors: Hans-Joachim Schulze, Ottobrunn (DE); Hans-Peter Felsl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/702,627

(22) Filed: Feb. 9, 2010

(65) Prior Publication Data

US 2010/0148215 A1   Jun. 17, 2010

Related U.S. Application Data

(62) Division of application No. 11/748,050, filed on May 14, 2007, now Pat. No. 7,687,891.

(51) Int. Cl.
*H01L 29/76* (2006.01)
*H01L 29/94* (2006.01)

(52) U.S. Cl. ........ 257/335; 257/337; 257/341; 257/378; 257/E29.066; 257/E29.197

(58) Field of Classification Search ................ 257/335, 257/337, 341, 378, E29.027, E29.066, E29.197; 438/234
See application file for complete search history.

(56) References Cited

U.S. PATENT DOCUMENTS

| | | | | |
|---|---|---|---|---|
| 5,757,081 A | * | 5/1998 | Chang et al. | 257/778 |
| 6,163,040 A | * | 12/2000 | Akiyama et al. | 257/131 |
| 6,228,719 B1 | * | 5/2001 | Frisina et al. | 438/268 |
| 7,317,225 B2 | * | 1/2008 | Saito et al. | 257/341 |
| 7,355,257 B2 | * | 4/2008 | Kishimoto et al. | 257/409 |
| 7,462,909 B2 | * | 12/2008 | Saito et al. | 257/329 |
| 7,595,536 B2 | * | 9/2009 | Terashima | 257/393 |

* cited by examiner

*Primary Examiner* — Ngan Ngo
(74) *Attorney, Agent, or Firm* — Coats & Bennett, P.L.L.C.

(57) ABSTRACT

An IGBT includes a first region, a second region located within the first region, a first contact coupled to the first region, a first layer arranged below the first region, a gate overlying at least a portion of the first region between the second region and the first layer and a second layer formed under the first layer. One or more stacked zones are formed within the second layer. Each one or more stacked zones includes a first zone and a second zone that overlies the first zone. Each first zone is inversely doped with respect to the second layer and each second zone is inversely doped with respect to the first zone. The IGBT further includes a third layer formed under the second layer and a second contact coupled to the third layer.

20 Claims, 10 Drawing Sheets

IGBT HAVING ONE OR MORE STACKED ZONES FORMED WITHIN A SECOND LAYER OF THE IGBT

PRIORITY CLAIM

This application is a divisional of U.S. patent application Ser. No. 11/748,050, filed 14 May 2007, the content of which is incorporated by reference herein in its entirety.

BACKGROUND

In the field of power semiconductor technology, it is desirable to provide semiconductor devices with protection mechanisms that prevent destruction of the semiconductor devices under extreme switching conditions. Such extreme switching conditions arise because power semiconductor diodes are operated in commutation mode. When operated in commutation mode, high electric fields can occur, for example at the n$^-$n junction of a pn$^-$n semiconductor diode, which can lead to an avalanche-like generation of charge carriers at the n$^-$n junction. At the same point in time, high electric field strengths can occur at the pn junction of the pn$^-$n semiconductor diode and lead to an avalanche-like generation of charge carriers at the pn-junction. The avalanche-like generation of charge carriers (so-called "avalanche generation") results in an inability to maintain the high electric field blocking capability of the semiconductor diode in the n$^-$-doped central region of the semiconductor diode. The semiconductor diode thus loses its blocking capability and is destroyed unless external measures for limiting current and power have been implemented.

In order to avoid destruction of the semiconductor diode, the commutation process of the diode can be slowed down. When using such semiconductor diodes within insulated gate bipolar transistor (IGBT) semiconductor modules, however, such a slow down can result in an increase in the switch-on losses of the IGBT. Other measures might lead to increased on-state or switching losses. Thus, there exists a need for an improved semiconductor device.

SUMMARY

According to an embodiment, a semiconductor device may comprise a first layer having a first conductivity type, a second layer having a second conductivity type, a third layer having the second conductivity type, and one or more first zones having the first conductivity type and located within the second layer. Each one of the one or more first zones is adjacent to the third layer. One or more second zones having the second conductivity type are located within the second layer, and each one of the one or more second zones is adjacent to one or more of the one or more first zones.

BRIEF DESCRIPTION OF THE DRAWINGS

The present invention is better understood by reading the following description of non-limiting embodiments with reference to the attached drawings which are briefly described as follows.

The invention is explained in more detail below in exemplary embodiments with reference to the figures, in which.

In the figures, identical or mutually corresponding components or groups of components are identified by the same reference numerals. It is to be noted, however, that the appended drawings illustrate only a few aspects of certain embodiments of this invention and are therefore not limiting of its scope, as the invention encompasses equally effective additional or equivalent embodiments.

DETAILED DESCRIPTION

Figure 1:
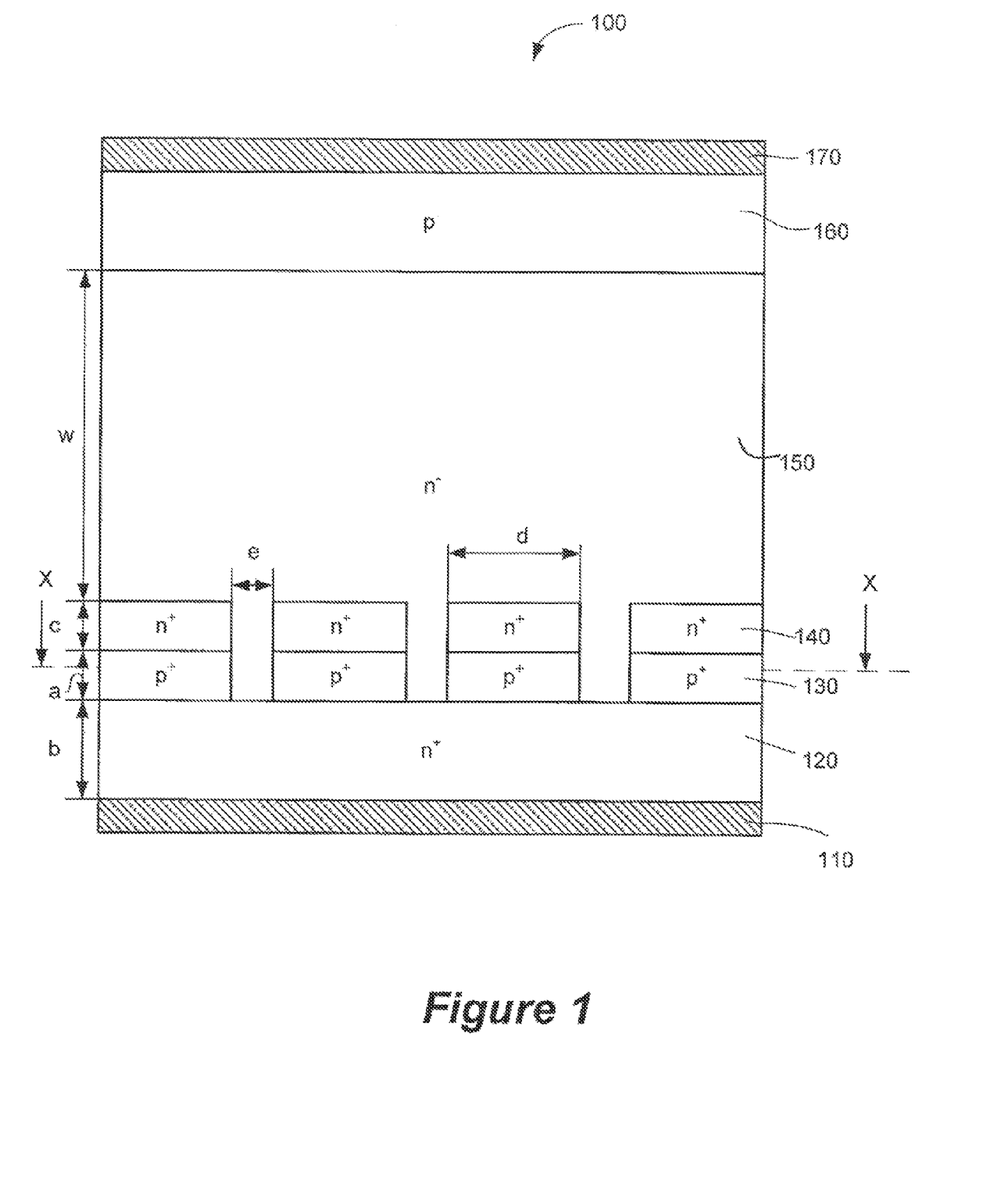
FIG. 1 shows a first embodiment of a diode.

FIG. 1 shows a first embodiment 100 of a semiconductor device which is a diode. The diode 100 includes an anode 170, a cathode 110, a semiconductor layer 120, a semiconductor layer 150 and a semiconductor layer 160. According to this embodiment, the semiconductor layer 120 can be n$^+$-doped, the semiconductor layer 150 can be n$^-$-doped and the semiconductor layer 160 can be p$^+$-doped. In other embodiments, semiconductor layers 120, 150 and 160 can be doped with other suitable implant types. A one or more p$^+$-doped semiconductor zones 130 are provided within the semiconductor layer 150 and, in this embodiment, may have, for example, a rectangular cross section and be spaced apart equidistantly from one another. In other embodiments, zones 130 can have other suitable cross sections as illustrated by line X-X in FIG. 1 and depicted as top views in FIGS. 10-14.

Figure 10:
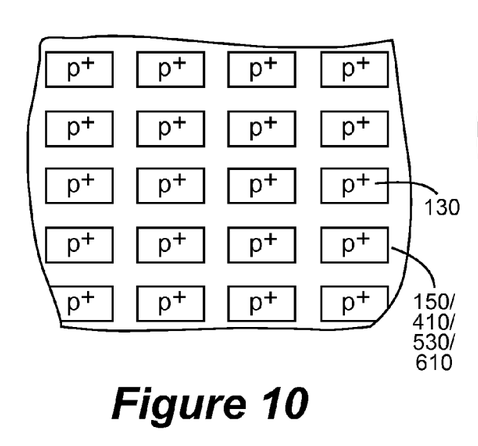
FIGS. 10-14 show top views of cross sections of different embodiments according to line X-X in FIGS. 1 and 4.
Figure 11:
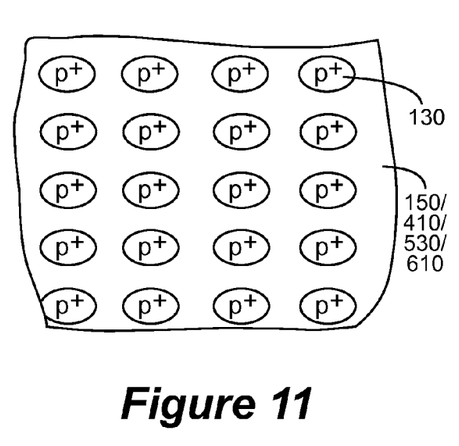
Figure 13:
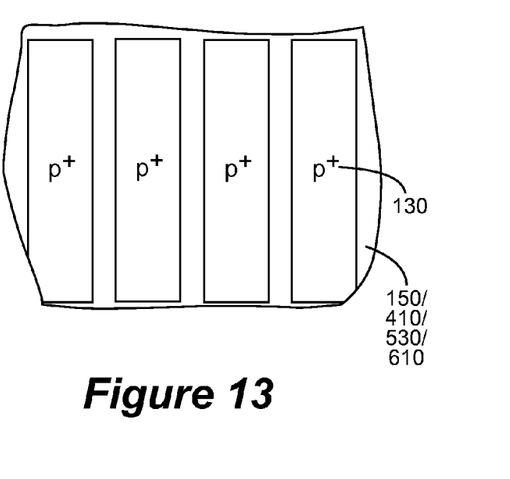
Figure 14:
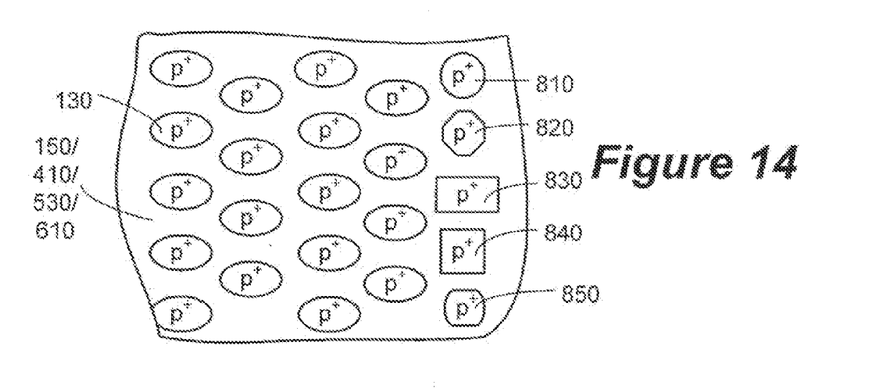

FIGS. 10-14 are top views cut at lines X-X according to FIG. 1 and show various embodiments of the placement and shape of zones 130 and 140 with respect to layer 150. For example, islands can be created as shown in FIGS. 10, 11, 13 and 14. FIG. 10 shows an embodiment of rectangular shaped zones 130 and FIG. 11 shows an embodiment of elliptical shaped zones 130 in the form of islands. FIG. 13 shows an embodiment of rectangular shaped zones 130 in the form of stripes. FIG. 14 shows an embodiment of another pattern for higher area ratios of zones 130 to layer 150 in the cross plane X-X. FIG. 14 also shows in the last row on the right, examples of other possible cross-sections for zones 130, such as a circular zone 810, a polygonal zone 820, a rectangular zone 830, a square zone 840, or a rounded square or rectangle zone 850. Cross sections other than the ones depicted in FIG. 14 are possible in other embodiments. Also, a cross section pattern with mixed shapes is possible in other embodiments. In various embodiments, combinations of placements and shapes are possible and can include one or more stripe-shaped islands, annular rings, etc.

Figure 12:
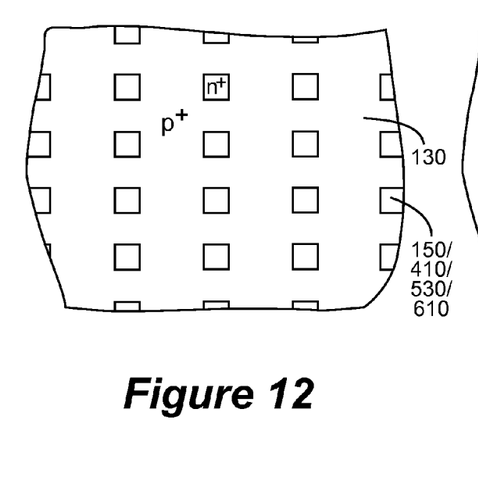

In various embodiments, implant masks in accordance with FIGS. 10-14 can be created. In one embodiment, FIG. 12 shows an inverse doping scheme in which an inverse mask with respect to FIG. 10 or FIG. 11 is used. In this embodiment, continuous p$^+$/n$^+$ doped layers 130 and 140 are formed. The inverse mask creates rectangular or circular spaces through respective doping in these layers to match the doping of layer 150. In other embodiments, other inverse schemes with respect to FIGS. 10, 11, 13 and 14 can be used.

FIGS. 10-14 show different embodiments of footprints of a semiconductor device and different coverage ratios. In one embodiment, the coverage is over 40% but less than 98% of the footprint of semiconductor layer 150. In various embodiments, the footprint of layer 150 is a total area of layer 150 and the coverage ratio is the area of one or more of the zones 140 divided by the area of layer 150. However, the ratio can also be more than 50% and up to 80%. The semiconductor zones 140 reduce the injection of semiconductor zones 130 due to the reduced emitter efficiency of the partial pnp transistor which is formed by the semiconductor zones 130 (p), the semiconductor zones 140 and layer 150 (n) and layer 160 (p). Also, the switching softness which is created on the back side between the semiconductor zones 130 and layer 120 is not influenced by the additional semiconductor zones 140. Thus the switching softness of diode 100 is maintained.

According to an embodiment, on top of each semiconductor zone 130 between the respective semiconductor zones 130 and the semiconductor layer 160 there are arranged one or more n+-doped semiconductor zones 140 with cross sections similar to zones 130. In other embodiments, one or more of the zones 140 have cross sections that are not similar to the cross sections of one or more of the zones 130. In one embodiment as shown in FIG. 1, a semiconductor zone 140 is stacked on top of an associated semiconductor zone 130 and forms a cover for the semiconductor zone 130. A stack is formed by associated semiconductor zones 130 and 140. One or more of the stacks with associated semiconductor zones 130 and 140 are arranged within layer 150. In one embodiment, the doping concentration of the semiconductor zones 140 is higher than the doping concentration of the base layer 150. In one embodiment, the semiconductor zones 140 have the same width as the semiconductor zones 130. In one embodiment, the semiconductor zones 130 are arranged at the same vertical height, their respective undersides directly adjoining the semiconductor layer 120. In one embodiment, the semiconductor zones 140 may have the same vertical height. However, in other embodiments, the plurality of semiconductor zones 130 may be arranged at different vertical locations and each zone may differ in width and height.

For zones 130 and 140, according to another embodiment, as shown in FIG. 12, an inverse doping scheme can be used by means of a respectively designed mask. Alternatively, according to another embodiment, a continuous p+ doped layer 130 can be created and rectangular or circular spaces are doped in this layer to match the doping of layer 150. Similar processes can be used to create the zones 140. In this embodiment, as shown in FIG. 12, single zones 130 and 140 with respective "holes" filled by layer 150 are formed.

In various embodiments, the thickness b of the semiconductor layer 120 can be 0.2 to 30 μm, the thickness of a or c or both a and c of the semiconductor zones 130 and 140 can be 0.1 to 20 μm, and the distance w between the semiconductor zones 140 and the semiconductor layer 160 can be equal to or greater than 30 μm. According to an embodiment, the distance between the first and second zones 130, 140 can be 0.2 μm-3 μm. In other embodiments, a, b, c and w can have other suitable values. According to an embodiment, the width d of one or more of the semiconductor zones 130 and 140 can be 1 to 200 μm, respectively and the distance e between one or more of the semiconductor zones 130, 140 can be 1 to 200 μm. In other embodiments, d and e can have other suitable values. In one embodiment, the doping of one or more of the semiconductor zones 130 is between $1e^{15}$ to $1e^{19}$ cm-3. According to an embodiment, the semiconductor zones 140 can be doped higher than the semiconductor layer 150. In one embodiment, the doping of one or more of the semiconductor zones 140 is between $1e^{15}$ to $1e^{19}$ cm-3. In other embodiments, the doping concentrations of zones 130 and 140 can have other suitable values. According to an embodiment, the semiconductor diode 100 can be designed for voltages within a range of 300V to 12,000V. In other embodiments, diode 100 can be designed for other voltages or voltage ranges. In various embodiments, the above mentioned values depend on the desired voltage class of the semiconductor device and are therefore not to be understood as a restriction but merely as an example.

In the embodiment illustrated in FIG. 1, when diode 100 commutates into the off state, the junction between semiconductor zones 130 and 140 is forward-biased and the junction between semiconductor layers 150 and 160 and the junction between semiconductor zones 130 and semiconductor layer 120 are reverse-biased. In one embodiment, the junction between semiconductor layers 150 and 160 can be designed for voltages within a range of 300V to 12,000V and the junction between semiconductor zones 130 and semiconductor layer 120 can be designed for voltages within a range of 10V to 100V. In other embodiments, the junction between semiconductor layers 150 and 160 and the junction between semiconductor zones 130 and semiconductor layer 120 can be designed to have other suitable voltage ranges.

In one embodiment, if a dynamic "avalanche" occurs at the junction between semiconductor layers 150 and 160, then the junction between semiconductor zones 130 and semiconductor layer 120 is likewise in the avalanche state. During this state, the charge carrier peak is still situated in the central zone of the diode. The junction between semiconductor zones 130 and semiconductor layer 120 then injects holes into the charge carrier peak. This prevents the charge carrier peak from being moved away from this junction. The injected holes compensate for the electrons coming from the junction between semiconductor layers 150 and 160 as a result of the dynamic avalanche. Consequently, in this embodiment, it is not possible for a space charge zone carried by the free electrons to build up between the charge carrier peak and the n+-type zone 120.

In one embodiment, the p-type zones formed by the semiconductor zones 130 are interrupted. The spaces between the semiconductor zones 130 and 140 can be represented by a resistance. In the case of a continuous p-type zone, a junction between zones 130 and 140 would effect blocking if the diode were operated in the forward direction. The resistance formed by the spaces between the stacked semiconductor zones 130 and 140 provide a shunt for small currents in the forward direction. At typical operating currents, the pnpn structure is activated, i.e. turned on, and is flooded with charge carriers. A dynamic avalanche arises at a pn junction on the cathode side, which leads to a stabilization of the electric field. The "soft recovery behavior" also improves as a result of the charge carrier peak sticking to the cathode side of the diode.

In one embodiment, if the space charge zone reaches the "upstream" p-type zones when the static reverse voltage is applied, then an increased reverse current arises through the open base npn transistor. However, the blocking capability is not lost. In one embodiment, an experiment found a step in the reverse current that corresponds to a reaching of the p-type region. The reverse current increased from 1 μA to 100 μA to 1 mA to 5 mA at 25° C.

In the illustrated embodiment, the semiconductor zones 140 increase the blocking performance of the diode 100 while maintaining the switching softness. Furthermore, in addition, the semiconductor zones 140 reduce the turn-off losses of the diode 100. The semiconductor zones 140 compensate for the losses in blocking performance that are created by the semiconductor zones 130. Without the semiconductor zones 140, the doping concentrations of the semiconductor zones 130 are limited to maximum values, for example, of approximately $1e^{17}$ cm$^{-3}$. However, the semiconductor zones 140 shift such a limitation to much higher values, for example, to $1e^{18}$ cm$^{-3}$.

The turn-off behavior of the diode 100 according to one of the embodiments that includes the semiconductor zones 140 is furthermore improved by reducing the turn-off power loss and reducing the oscillation tendency. Also, the snap-off voltage of such a device is increased and the safe operating area (SOA) is increased. In one embodiment, the coverage area of the semiconductor zones 130 and 140 should not be too large because otherwise such a device could snap-off due to the effective backside emitter area becoming too small.

In various embodiments, diode 100 can be manufactured with known processes. In one embodiment, the semiconductor zones 140 can be manufactured by using the same implantation mask that was used for creating the semiconductor zones 130. This mask can, in one embodiment, be used to perform a masked ion implantation of donors, for example phosphor atoms. According to another embodiment, masked proton irradiation, which can induce donor like states in the band gap of the semiconductor, can be used. The energy used for this implantation can, in one embodiment, be chosen such that the penetration depth of the donors exceeds the penetration depth of the acceptors. Thus, a predetermined doping profile is created after the following high temperature manufacturing steps. In one embodiment, the semiconductor zones 140 directly abut the semiconductor zones 130 in a vertical direction as shown in FIG. 1. In this embodiment, the lateral extension of the semiconductor zones 140 can be similar to the semiconductor zones 130.

Figure 2:
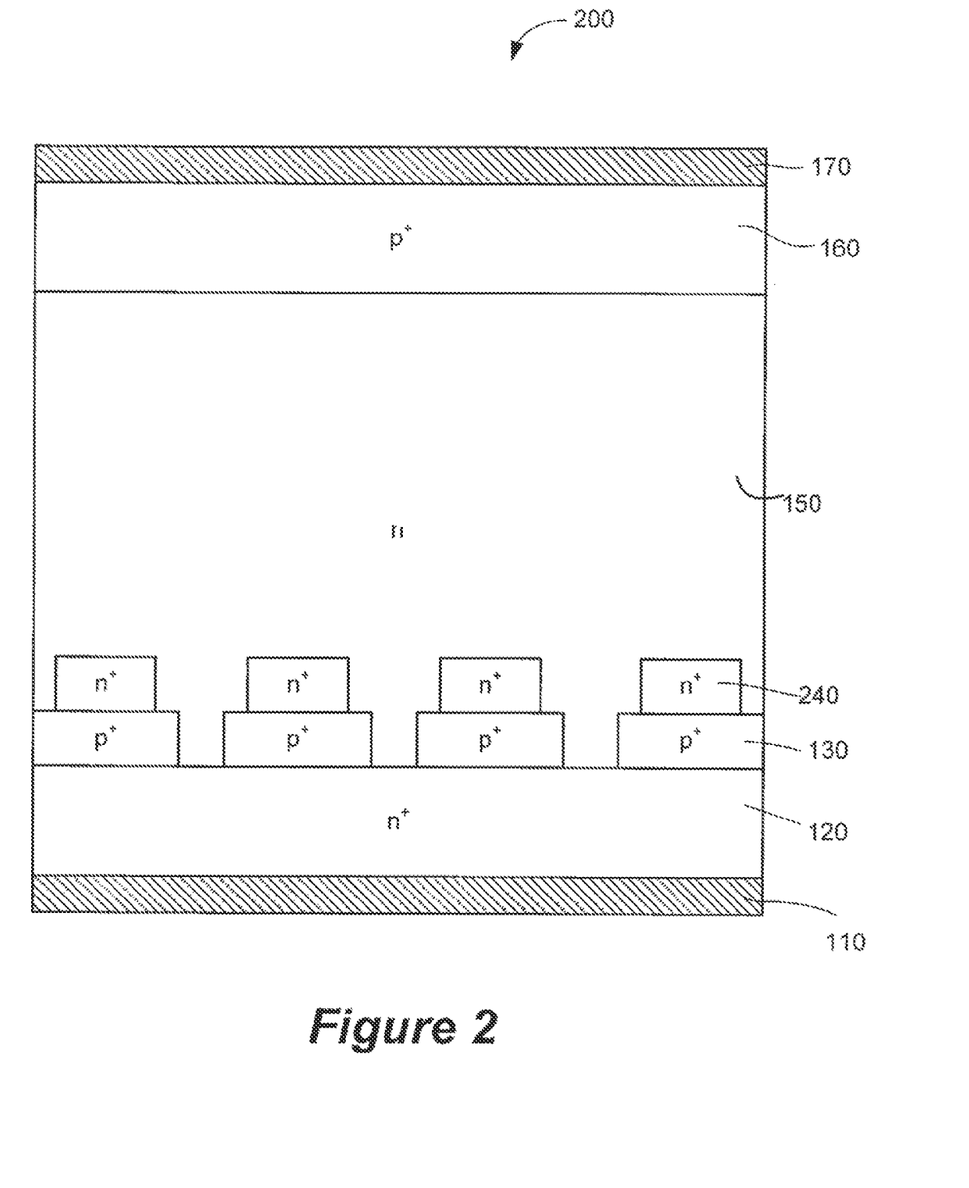
FIG. 2 shows a second embodiment of a diode.

FIG. 2 shows a second embodiment 200 of a semiconductor device which is a diode. In this embodiment, the lateral extension of the one or more semiconductor zones 240 within diode 200 can deviate from the lateral extension of the one or more semiconductor zones 130. In this embodiment, the semiconductor zones 240 have a width that is less than the width of zones 130. In other embodiments, the width of each semiconductor zone 240 can be larger than a width of an associated zone 130.

Figure 3:
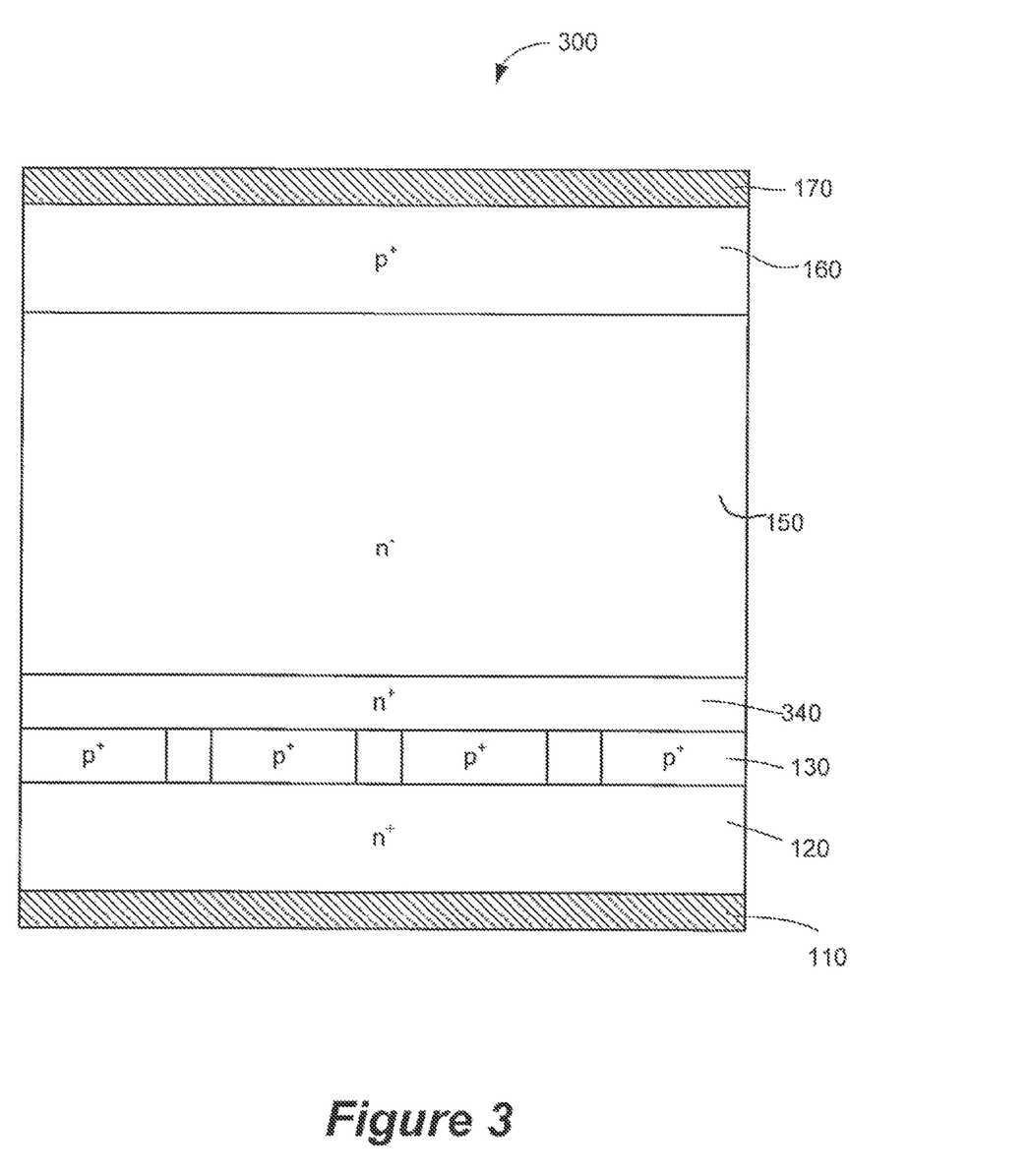
FIG. 3 shows a third embodiment of a diode.

FIG. 3 shows a third embodiment 300 of a semiconductor device which is a diode. In this embodiment, the width of the one or more semiconductor zones 340 is greater than the width of the one or more semiconductor zones 130. In this embodiment, a continuous layer 340 is formed above the semiconductor zones 130.

Figure 4:
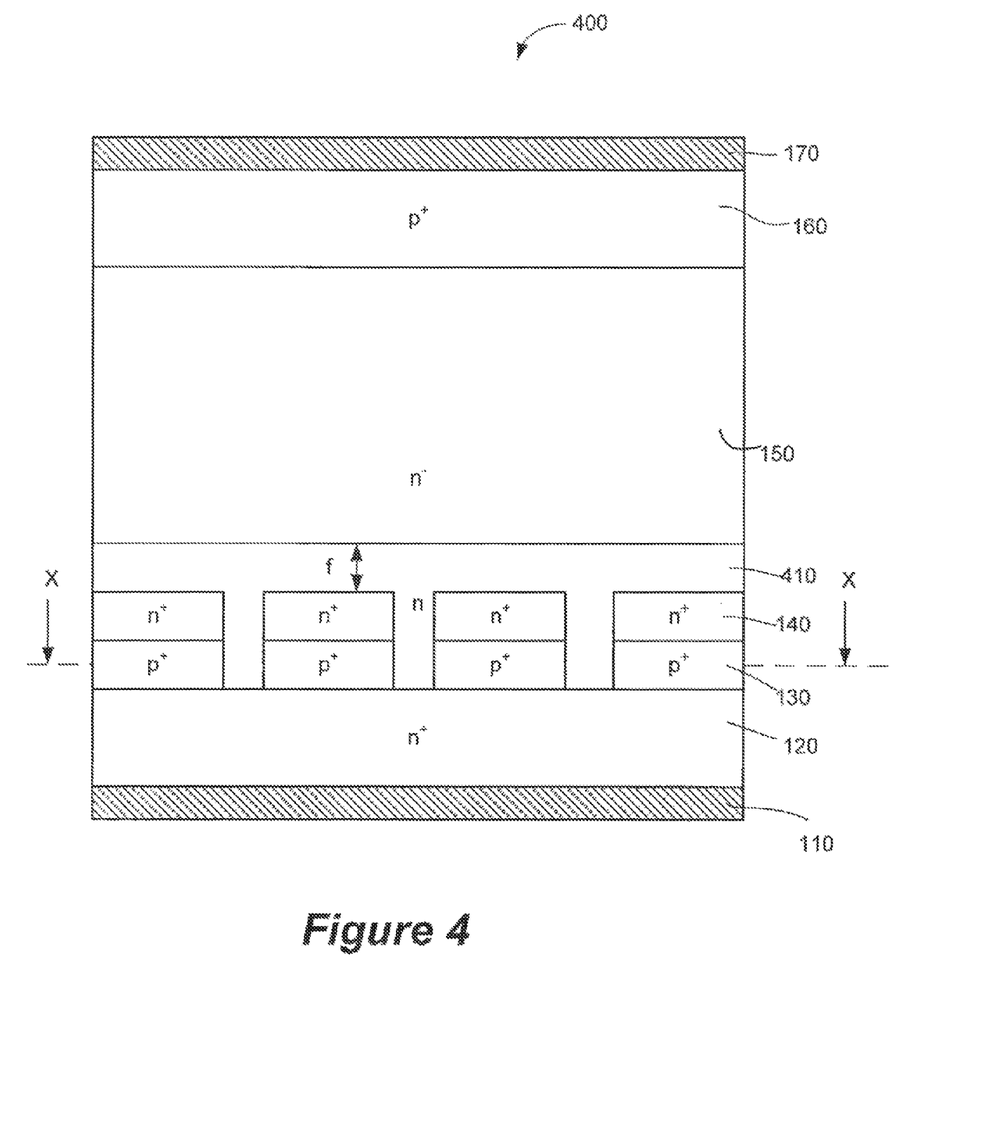
FIG. 4 shows a fourth embodiment of a diode.

FIG. 4 shows a fourth embodiment 400 of a semiconductor device which is a diode. The semiconductor diode 400 includes an anode 170, a cathode 110, a semiconductor layer 120, a semiconductor layer 410, a semiconductor layer 150 and a semiconductor layer 160. In this embodiment, the semiconductor layer 120 is $n^+$-doped, the semiconductor layer 410 is n-doped, the semiconductor layer 150 is $n^-$-doped and the semiconductor layer 160 is $p^+$-doped. Thus, compared with the embodiment shown in FIG. 1, in this embodiment, an additional semiconductor layer 410 is included, for example, within layer 150. In one embodiment, the layer 410 is n-doped and at least partly surrounds the semiconductor zones 130 and 140. FIGS. 10, 11, 13 and 14 show top views of possible embodiments for zones 130 and 140. In another embodiment, as shown in FIG. 12, layer 410 fills "holes" in the plane of zones 130 and 140 which are surrounded by zones 130 and 140, respectively.

In one embodiment, semiconductor layer 410 serves as a buffer for the extent of the space charge zone and the doping concentration of semiconductor layer 410 is between $1e^{13}$ and $1e^{18}$ $cm^{-3}$, corresponding to a dose of $1e^{11}$-$1e^{14}$ $cm^{-2}$. In one embodiment, the distance f between the top sides of the semiconductor zones 140 and the junction between the semiconductor layer 410 and the semiconductor layer 150 is between 5 and 55 μm. In other embodiments, the distance f can have other suitable values. In one embodiment, semiconductor layer 410 shifts the steep current increase in the reverse current profile toward higher voltage values. In one embodiment, the junction between semiconductor layers 150 and 160 can be designed for voltages within a range of 300V to 12,000V, and the junction between semiconductor zones 130 and semiconductor layer 120 can be designed for voltages within a range of 10V to 100V. In other embodiments, the junction between semiconductor layers 150 and 160 and the junction between semiconductor zones 130 and semiconductor layer 120 can be designed to have other suitable voltage ranges.

In various embodiments, with suitable dimensioning of the proportion of the areas of the respective stacked semiconductor zones 130 and 140 and their respective distances from one another and from the cathode 110, the flooding of the component with charge carriers can be modulated or controlled. The greater the proportion of p-type area, the lower the charge carrier density of the flooding charge in the upstream $n^-$-type region. As a result, the forward voltage and switching losses can be varied in a targeted manner.

In various embodiments, zone 140/240/340 and/or zone 410 may comprise donors which can be generated through phosphor doping or/and selenium doping or/and sulfur doping, or/and proton radiation.

According to embodiments of the invention, the $p^+$-type zones 130 and the $n^+$-type zones 140 do not reach to the cathode metallization 110. Such a configuration may lead to a late and abrupt commencement of the injection of holes. Furthermore, this configuration may reduce the ability in various embodiments to dimension the doping regions so as to bring about a soft switching behavior and prevent high field strengths at the nn+ junction. The operating properties with regard to the different bias current densities and voltages that are used during typical operation may be difficult to achieve, either because the diode no longer has sufficient blocking capability at small current densities and/or high voltages, or because holes are no longer injected at high current densities and/or low voltages.

In the illustrated embodiments, the commutation strength by means of stabilizing the dynamic avalanche at the cathode during switching is improved. The illustrated semiconductor diode embodiments avoid the occurrence of destructive electric fields at the nn+ junction of layers 120 and 410 without the semiconductor diode having to have such a large central zone thickness that a dynamic "avalanche" at the pn junction of the semiconductor diode is ended before an electric field can form at the $nn^+$ junction.

Figure 5:
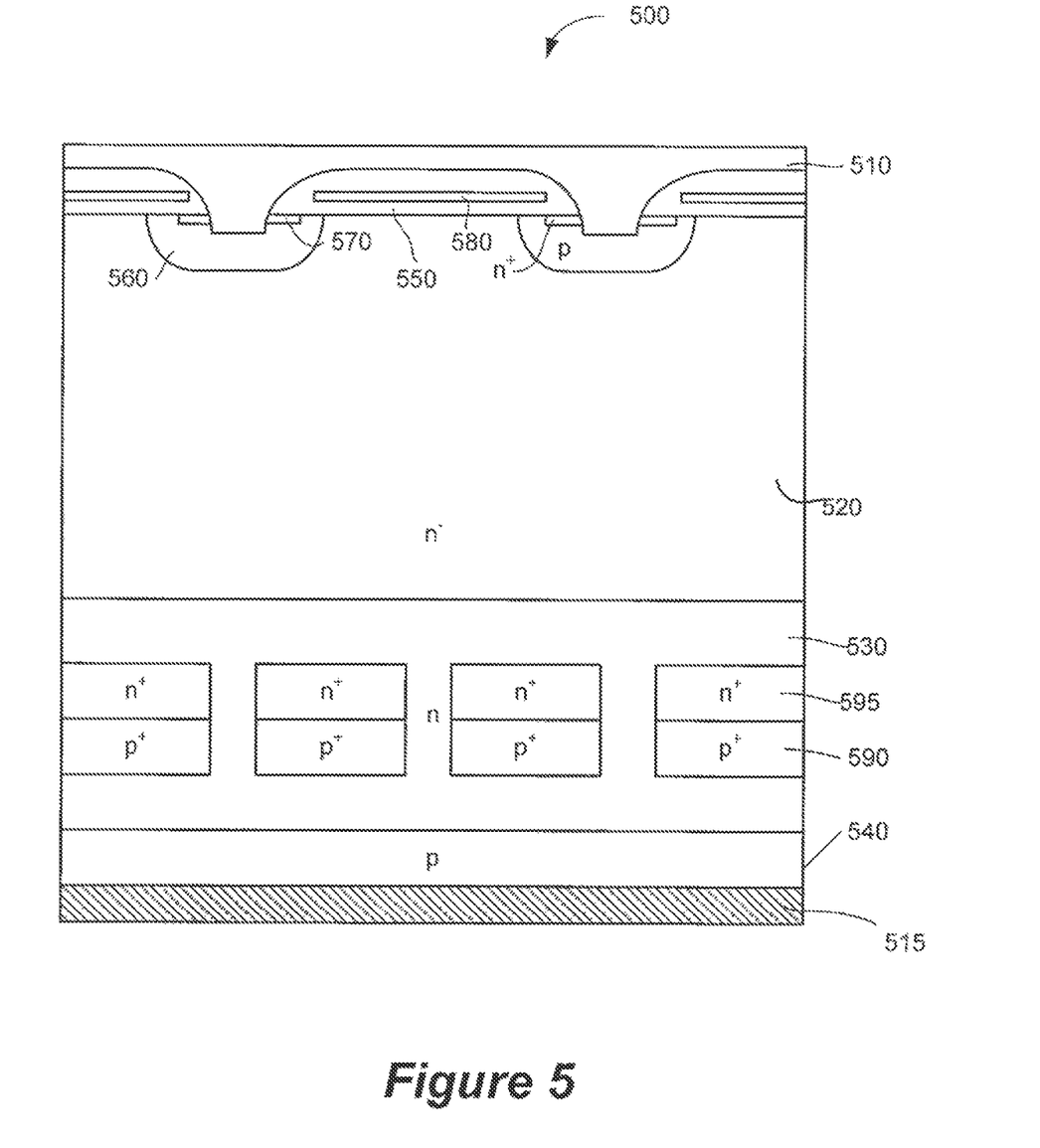
FIG. 5 shows a first embodiment of an IGBT.

FIG. 5 shows a first embodiment 500 of a semiconductor device which is an insulated gate bipolar transistor (IGBT). In the illustrated embodiment, IGBT 500 includes a rear side contact 515, a front side contact 510, between which a semiconductor layer 540, a semiconductor layer 530 and a semiconductor layer 520 are arranged. In one embodiment, the semiconductor layer 540 is a p-type layer, the semiconductor layer 530 is an n-type field stop layer, and the semiconductor layer 520 is an $n^-$-type drift region. In one embodiment, one or more p-doped body regions 560 are incorporated into the semiconductor layer 520, and each body region 560 includes one or more n-doped regions 570. One or more gates 580 are provided which are insulated from the semiconductor layer 520 and the front side contact 510 by means of an oxide layer 550 that electrically insulates the one or more gates 580 from the layer 520. IGBT 500 includes one or more stacked semiconductor zones 590 and 595 which are formed in the semiconductor layer 530. Each stack includes a $p^+$-doped bottom region 590 on top of which an $n^+$-doped top region 595 is formed. In various embodiments, the stack formed from zones 590 and 595 is similar to the stacks formed from zones 130 and 140/240/340 that are illustrated in FIGS. 1-4.

In the illustrated embodiment, the stacked regions 590 and 595 change the field strength profile in a vertical direction within the area of layers 530 and 520. The semiconductor zones 590 and 595 generate a field peak within the electric field strength profile, which may lead to an avalanche-like generation of charge carriers.

Figure 6:
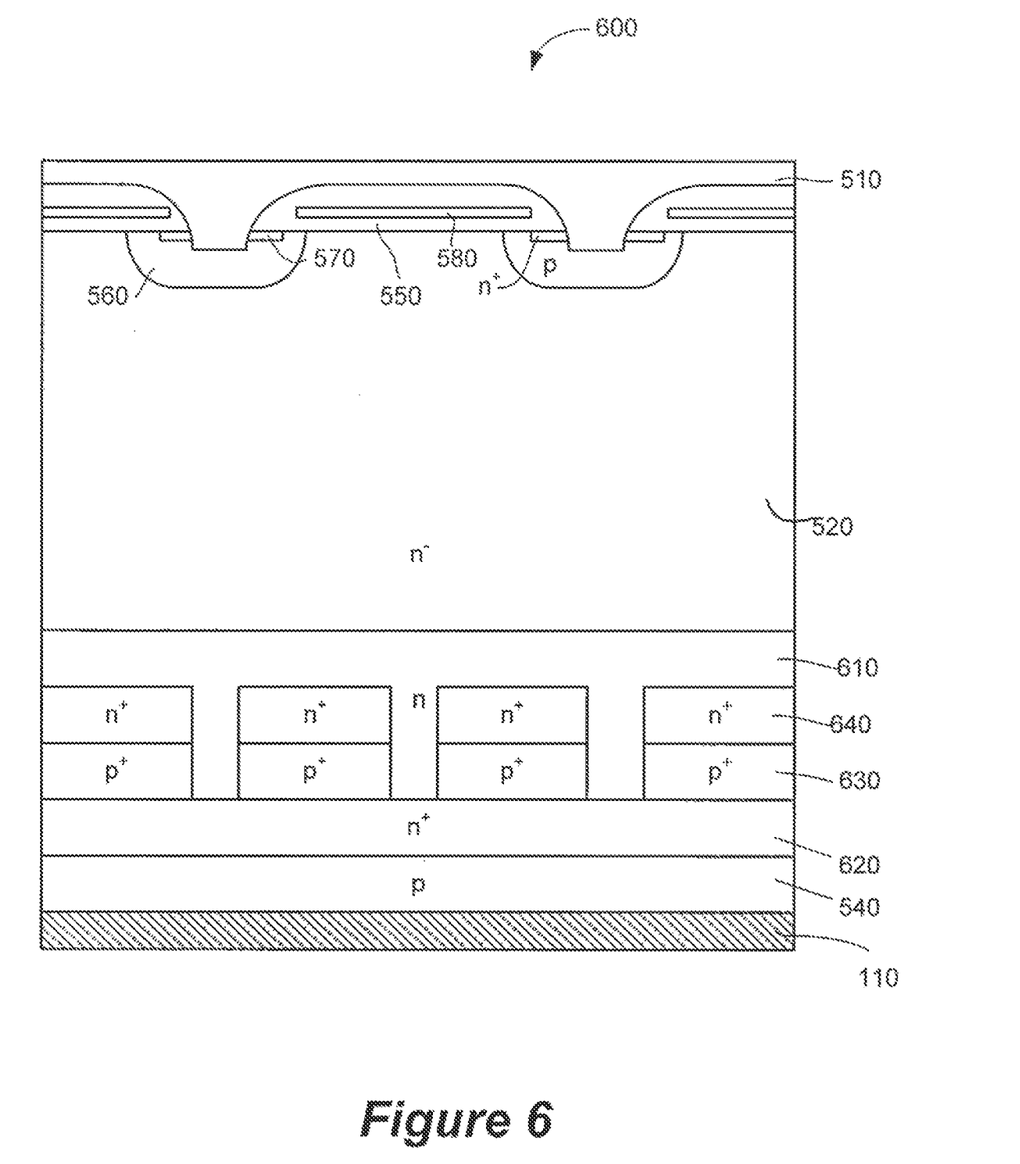
FIG. 6 shows a second embodiment of an IGBT.

FIG. 6 shows a second embodiment 600 of a semiconductor device which is an IGBT. In the embodiment shown in FIG. 6, the semiconductor layer 530 of FIG. 5 is divided into an n$^+$-doped layer 620 and an n-doped layer 610. The stacked semiconductor zones 630 and 640 are formed within layer 610 and adjoin in part junction layer 620 and layer 610. In one embodiment, layers 610, 620, 630 and 640 correspond, respectively, to layers 410, 120, 130 and 140 illustrated in FIG. 4.

Figure 15:
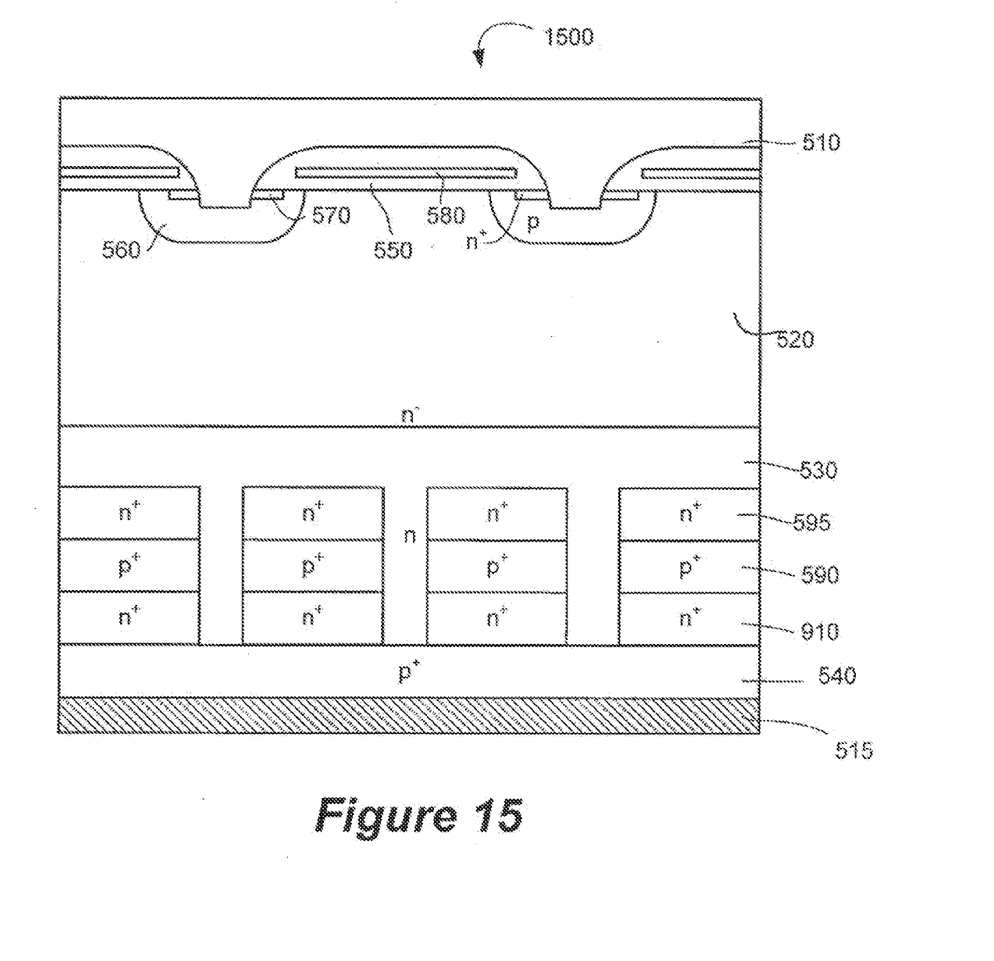
FIG. 15 shows a third embodiment of an IGBT.

FIG. 15 shows a third embodiment 1500 of a semiconductor device which is an IGBT. According to the embodiment shown in FIG. 15, layer 620 as illustrated in FIG. 6 is patterned to form zones 910. The zones 910 are n$^+$-doped and the layer 530 between zones 910 is doped similarly to layer 610. In the illustrated embodiment, zones 910 are arranged so that on the top side they adjoin zones 590 and on the bottom side they adjoin p$^+$-doped layer 540.

In one embodiment, the doping concentration of the p$^+$-doped semiconductor zones 590/630 can be $5e^{17}$ cm$^{-3}$ or higher. In one embodiment, the doping concentration of the semiconductor zones 595/640 is within a range of $1e^{15}$ to $1e^{19}$ cm$^{-3}$. In other embodiments, the doping concentrations of zones 590/630 or 595/640 can have other suitable values.

In one embodiment, the distance between the p-doped body regions 560 and the stacked semiconductor zones 590/630 and 595/640 depends on a desired blocking capability and can be equal to or greater than 30 µm. In other embodiments, the distance between the p-doped body regions 560 and the stacked semiconductor zones 590/630 and 595/640 can have other suitable values. In one embodiment, the distance between the stacked semiconductor zones 590/630 and 595/640 and the junction between the semiconductor layers 530/610 and layer 520 can be 5 µm to 55 µm. In other embodiments, the distance between the stacked semiconductor zones 590/630 and 595/640 and the junction between the semiconductor layers 530/610 and layer 520 can have other suitable values. In one embodiment, the thickness of the semiconductor zones 590/630 and 595/640 can each be 0.1 µm to 20 µm, the width can be 2 µm to 200 µm, and the lateral distance between the stacked semiconductor zones 590/630 and 595/640 can be 1 µm to 200 µm. In other embodiments, the thickness and width of the semiconductor zones 590/630 and 595/640 and the lateral distance between the stacked semiconductor zones 590/630 and 595/640 can have other suitable values.

In one embodiment, one method of inducing a controlled injection of holes into the base zone of the IGBT during the turn-off process or during a short circuit comprises integrating the stacked semiconductor zones with the p-doped islands and n-doped covers into the field stop zone. The intensity of the hole injection and the temporal profile thereof may be controlled by way of the design of the islands, for example, by their width in the lateral direction and their doping concentration. According to an embodiment, the injection should be chosen, on the one hand, to be high enough that the desired turn-off softness results especially under hard switching conditions, but on the other hand, to not be too high in order to keep the turn-off losses under normal switching conditions as low as possible. In one embodiment, the p-doped islands should be designed not to have contact with the rear side metallization or with the rear side p-type emitter, and should be isolated by an n-type region.

In some embodiments of the IGBT device 500/600/1500, the p-doped layers buried in the field stop zone may be realized means of a high-energy ion implantation or by means of the application of wafer bonding techniques or epitaxy. In some embodiments, the planar cell structure on the front side may also be replaced by a trench cell structure.

In the illustrated embodiments, the hole injection caused by the p-type islands is caused by virtue of the fact that a voltage that exceeds the reverse voltage of the pn junction between semiconductor zones 630 and semiconductor layer 620 occurs between the p-type island and the adjoining n-type doping during turn-off or in the event of a short circuit. The current generated as a result of the avalanche is injected as hole current and serves for softer turn-off or stabilization of the electric field in the event of a short circuit.

The introduction of a field stop layer with increased n-type doping results in a further degree of freedom for determining the voltage from which the p-type islands are actually able to inject. As a result, in the case of low intermediate circuit voltages or applications with a low stray inductance and correspondingly low overvoltage peaks during switching, the injection and the associated increase in the turn-off losses can be avoided.

Figure 7:
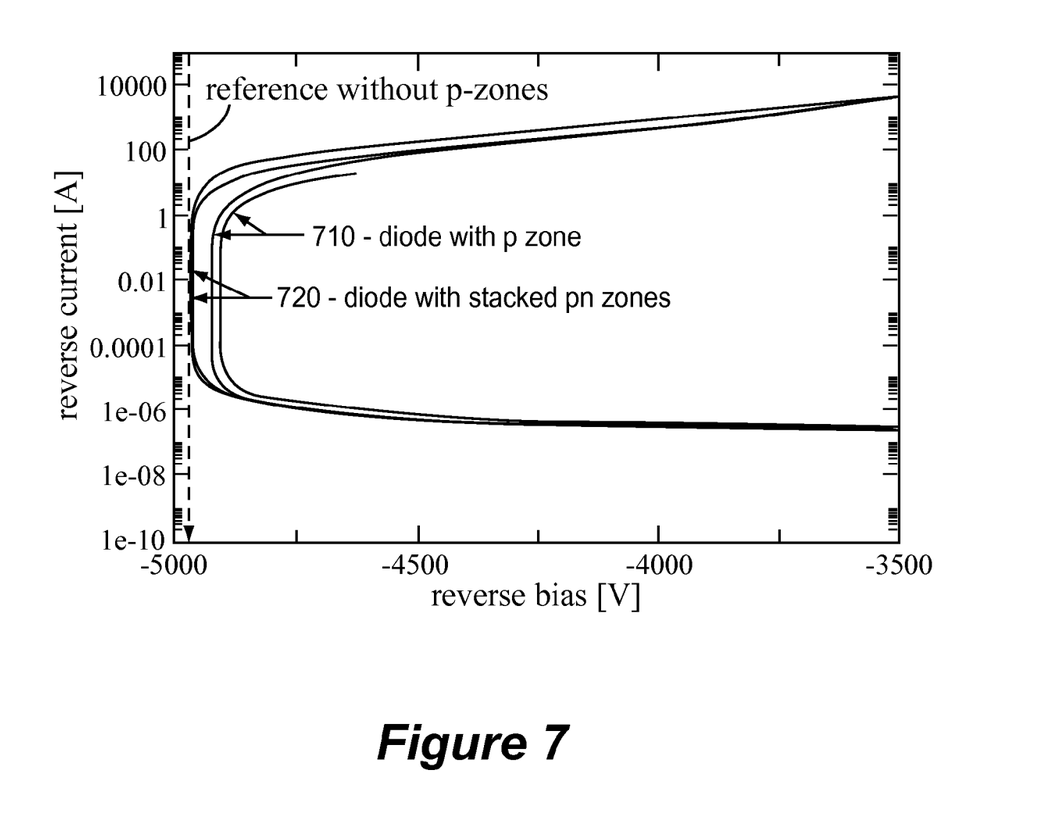
FIGS. 7-9 are diagrams showing the blocking capacity of embodiments of a diode.
Figure 8:
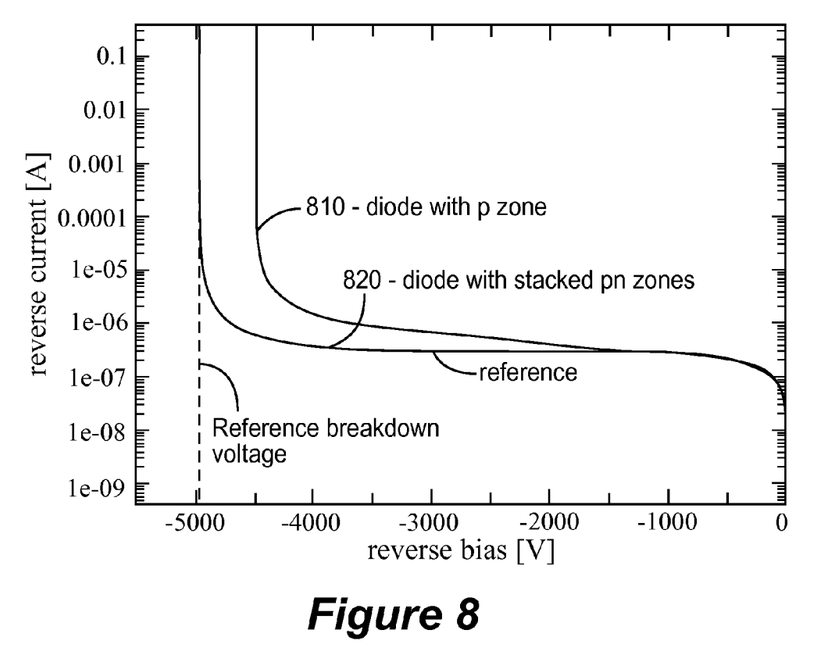
Figure 9:
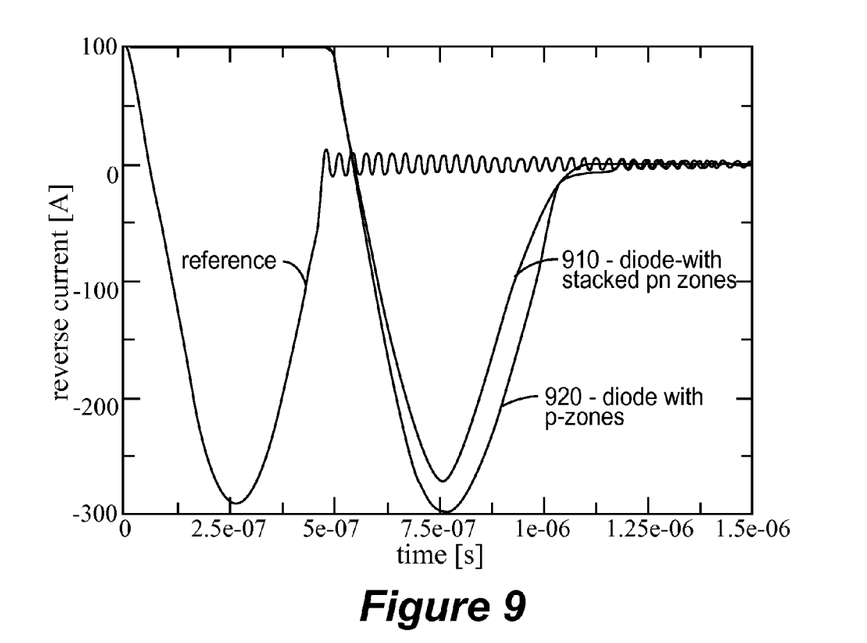

FIGS. 7-9 are diagrams showing the blocking capacity of embodiments of a diode. In FIG. 7, the blocking capacity of a conventional diode with single p-zones is shown at curve 710. The improved blocking capacities for diodes according to the different embodiments are illustrated at 720. The dotted line marks the reference breakdown voltage of a reference diode without any additional zones. Curves 720 show that the stacked pn zones 130/140 increase the blocking capability to the value of the reference diode without additional p zones. Curve 710 shows that the diodes only comprising p doped zones 130 have a reduced breakdown voltage. The p-doped zones 130 are in this case moderately doped.

FIG. 8 shows the same reverse current behavior of a diode according to the different embodiments (illustrated at 820), a reference diode (illustrated as "reference") and a diode with stand alone p zones (illustrated at 810) as shown in FIG. 7 in more detail in a specific range. The dotted line marks the reference breakdown voltage of the reference diode. The reverse current response curve for embodiments of a reference diode ("reference") and a diode according to various embodiments that include the stacked pn zones (illustrated at 820) are identical or similar. The reverse current level for different embodiments of the diode is the same or similar to the reverse current level of the reference diode.

FIG. 9 shows the reverse recovery behavior of a diode according to the different embodiments with stacked pn zones (illustrated at 910), a reference diode without additional p zones (illustrated as "reference") and a diode only comprising stand alone p zones (illustrated at 920). The diode according to the different embodiments (illustrated at 910) does not snap off and has a reduced reverse recovery current peak and a reduced reverse recovery charge.

In some embodiments, an additional current is generated by means of avalanche under critical operating conditions and is injected as hole current thereby leading to a "softer" turn-off, or stabilization of electric fields in the event of a short circuit.

In some embodiments of the diodes or IGBTs illustrated above, the p-type islands 130, 590 and 630 have polygonal or circular cross sections or have a stripe shape. In some embodiments, the n-type covering zones 140, 240, 595 and 640 can have a similar shape as p-type islands 130, 590 and 630 or can be continuous as with n-type zone 340. In some embodiments, each p-type island 130, 590 and 630 may be aligned or not aligned to adjacent p-type island 130, 590 and 630 or may be aligned or not aligned to other structures such as those illustrated at 550, 560, 570 or 580 for IGBT 500/600/1500. In some embodiments, the number of p-type islands 130, 590 and 630 can have a simple integral ratio to the grid of the front or tope side structure such as those illustrated at 550, 560, 570 or 580 for IGBT 500/600/1500.

As illustrated above, FIGS. 10-14 show top views of cross sections of different embodiments according to line X-X in FIGS. 1 and 4. These embodiments also apply to all other embodiments discussed in this specification, including IGBT 500/600/1500.

In some embodiments of IGBT 500/600/1500, the n-type doping introduced into the n-type field stop layer 530/610 may have a dopant concentration that is within a range of $2e^{11}/cm^2$ to $2e^{12}/cm^2$. In some embodiments, this dopant concentration is located between p-type island 590/630 and layer 520. In some embodiments, the dopant may be introduced by means of ion implantation in combination with one or more annealing or diffusion steps. Again, in various other embodiments, zone 595/640/910 and/or field stop layer 530/610 may comprise donors which can be generated through phosphor doping or/and selenium doping or/and sulfur doping, or/and proton radiation.

In some embodiments, the density of the p-type islands 130, 590 and 630 and the n-type covering zones 140, 240, 595 and 640 can vary in lateral directions. In these embodiments, the width of the p-type islands 130, 590 and 630 and the n-type covering zones 140, 240, 595 and 640 can vary in the lateral direction. In these embodiments, the distance between adjacent p-type islands 130, 590 and 630 and n-type covering zones 140, 240, 595 and 640 can vary in the lateral direction. In some diode embodiments, there is a higher density of islands in proximity to the termination of the blocking pn junction between layers 150 and 160. In some IGBT embodiments, there is a higher density of islands in proximity to the termination of the blocking pn junction between layers 150 and 160. In some embodiments, the density can vary to an extreme in which no islands are present in a specific area.

What is claimed is:

1. An IGBT, comprising:
a first region;
a second region located within the first region;
a first contact coupled to the first region;
a first layer arranged below the first region;
a gate overlying at least a portion of the first region between the second region and the first layer;
a second layer formed under the first layer;
one or more stacked zones formed within the second layer, wherein each one or more stacked zones comprises a first zone and a second zone that overlies the first zone, wherein each first zone is inversely doped with respect to the second layer, and wherein each second zone is inversely doped with respect to the first zone;
a third layer formed under the second layer; and
a second contact coupled to the third layer.

2. The IGBT of claim 1, wherein the first layer is n-type, the second layer is n-type and the third layer is p-type.

3. The IGBT of claim 2, wherein the second zone has a higher doping concentration than the second layer or the first layer.

4. The IGBT of claim 2, wherein the first zone has a higher doping concentration than the third layer or the first region.

5. The IGBT of claim 1, further comprising a fourth layer arranged between the second layer and the third layer so that the fourth layer is adjacent to each one of the first zones and the third layer.

6. The IGBT of claim 5, wherein the first layer is n-type, the second layer is n-type, the third layer is p-type and the fourth layer is n-type.

7. The IGBT of claim 6, wherein the fourth layer and the second zone have a higher doping concentration than the second layer or the first layer.

8. The IGBT of claim 6, wherein the first zone has a higher doping concentration than the third layer or the first region.

9. The IGBT of claim 5, wherein the fourth layer is divided into a plurality of third zones each of which overlies one of the plurality of third zones.

10. The IGBT of claim 1, wherein each one of the first zones is spaced at a distance from a junction between the second layer and the third layer.

11. The IGBT of claim 1, wherein a density of the first zones and the second zones varies in a lateral direction.

12. The IGBT of claim 1, wherein a density in a junction termination area is different than a density in an active area.

13. The IGBT of claim 1, wherein the one or more stacked zones have a cross sectional shape in a horizontal plane that is selected from the group consisting of: circular, elliptical, rectangular, square, and polygonal.

14. A method of manufacturing an IGBT, comprising:
forming a semiconductor device having a first layer with a first region and a second region located within the first region, a second layer arranged below the first layer and a third layer formed under the second layer;
forming one or more stacked zones within the second layer, wherein each one or more stacked zones comprises a first zone and a second zone that overlies the first zone, wherein each first zone is inversely doped with respect to the second layer, and wherein each second zone is inversely doped with respect to the first zone;
forming a gate overlying at least a portion of the first region between the second region and the first layer;
forming a first contact coupled to the first region; and
forming a second contact coupled to the third layer.

15. The method of claim 14, further comprising forming a fourth layer between the second layer and the third layer so that the fourth layer is adjacent to each one of the first zones and the third layer.

16. The method of claim 15, further comprising dividing the fourth layer into a plurality of third zones each of which overlies one of the plurality of third zones.

17. The method of claim 14, comprising doping each first zone so that each first zone has a higher doping concentration than the third layer or the first region.

18. An IGBT, comprising:
a first region means;
a second region means located within the first region means;
a first contact means for coupling to the first region means;
a first layer means arranged below the first region means;
a gate means overlying at least a portion of the first region means between the second region means and the first layer means;
a second layer means formed under the first layer means;
one or more stacked zone means formed within the second layer means, wherein each one or more stacked zone means comprises a first zone means and a second zone means that overlies the first zone means, wherein each first zone means is inversely doped with respect to the second layer means, and wherein each second zone means is inversely doped with respect to the first zone means;

a third layer means formed under the second layer means; and a second contact means coupled to the third layer means.

19. The IGBT of claim 18, further comprising a fourth layer means arranged between the second layer means and the third layer means so that the fourth layer means is adjacent to each one of the first zone means and the third layer means.

20. The IGBT of claim 19, wherein the fourth layer means is divided into a plurality of third zone means each one of which overlies one of the plurality of third zone means.

* * * * *